(12) United States Patent
Chien et al.

(10) Patent No.: US 8,863,047 B1
(45) Date of Patent: Oct. 14, 2014

(54) PHOTOLITHOGRAPHY CAPACITY PLANNING SYSTEM AND NON-TRANSITORY COMPUTER READABLE MEDIA THEREOF

(71) Applicant: National Tsing Hua University, Hsinchu (TW)

(72) Inventors: Chen-Fu Chien, Hsinchu (TW); Jei-Zheng Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 14/058,534

(22) Filed: Oct. 21, 2013

(30) Foreign Application Priority Data

Aug. 12, 2013 (TW) .................................. 102128858

(51) Int. Cl.
*G06F 17/50* (2006.01)
(52) U.S. Cl.
CPC ..................................... *G06F 17/50* (2013.01)
USPC .......................................................... 716/54
(58) Field of Classification Search
USPC .................................................. 716/100, 54
See application file for complete search history.

(56) References Cited

U.S. PATENT DOCUMENTS

| | | | |
|---|---|---|---|
| 6,892,106 B2* | 5/2005 | Wu et al. ........................ 700/101 |
| 7,142,937 B1* | 11/2006 | Chin et al. ....................... 700/99 |
| 7,610,111 B2* | 10/2009 | Lin et al. ........................ 700/101 |
| 8,615,416 B2* | 12/2013 | Milne ........................... 705/7.12 |
| 2004/0186605 A1* | 9/2004 | Wu et al. ........................ 700/102 |
| 2005/0171828 A1* | 8/2005 | Denton et al. .................... 705/8 |
| 2006/0259173 A1* | 11/2006 | Chin et al. ....................... 700/99 |
| 2007/0038657 A1* | 2/2007 | Denton et al. ................. 707/101 |
| 2007/0203773 A1* | 8/2007 | Milne ............................... 705/8 |
| 2008/0195241 A1* | 8/2008 | Lin et al. ....................... 700/101 |

* cited by examiner

*Primary Examiner* — Suchin Parihar
(74) *Attorney, Agent, or Firm* — Muncy, Geissler, Olds & Lowe, P.C.

(57) ABSTRACT

The present invention relates to a photolithography capacity planning system and a non-transitory computer readable media thereof. The photolithography capacity planning system includes a cost calculation module, a capacity calculation module, a demand calculation module, and a data processing module. The cost calculation module calculates a production cost, an unfulfilled demand cost, and a mask cost of the photolithography manufacturing process. The capacity calculation module calculates a capacity of light sources, a capacity of shared equipments, and a capacity of specified equipments of the photolithography manufacturing process. The demand calculation module calculates a quantity of unfulfilled demand. The data processing module produces a planning result.

16 Claims, 4 Drawing Sheets

PHOTOLITHOGRAPHY CAPACITY PLANNING SYSTEM AND NON-TRANSITORY COMPUTER READABLE MEDIA THEREOF

CROSS-REFERENCE TO RELATED PATENT APPLICATION

This application claims priority to and the benefit of Taiwan Patent Application No. 102128858, filed on Aug. 12, 2013, in the Taiwan Intellectual Property Office, the entire contents of which are hereby incorporated by reference.

BACKGROUND OF THE INVENTION

1. Field of the Invention

The present invention relates to a photolithography capacity planning system and non-transitory computer readable media thereof, especially relates to a photolithography capacity planning system and non-transitory computer readable media thereof providing a cost information by a cost calculation module, a capacity information by a capacity calculation module, an unfulfilled demand information by a demand calculation module, and a planning result to a user by a data processing module.

2. Description of Related Art

Photolithography manufacturing process is extremely costly among many semiconductor manufacturing processes. During the new tape out period, manufacturers usually produce one mask which is to be used in the production line, and only when the production capacity can not meet the demand will manufacturers produce more masks. However, producing more masks takes time. The time gap when the newly added masks are not ready to be used in the production line also results in the unfulfilled demand cost for manufactures. Besides, high end equipments can be used to support low end production line when the low end equipments can not meet the demand. However, using high end equipments to support low end production line requires equipment adjustment and verification time. The time gap when the high end equipments can not be used to support low end production line also decreases the revenues received by corporations.

SUMMARY OF THE INVENTION

Based on the aforementioned problems, the purpose of the present invention is to provide a photolithography capacity planning system and non-transitory computer readable media thereof which provides a cost information by a cost calculation module, a capacity information by a capacity calculation module, an unfulfilled demand information by a demand calculation module, and a planning result to a user by a data processing module.

According to one aspect of the present invention, providing a photolithography capacity planning system, the system includes a cost calculation module, a capacity calculation module, a demand calculation module, and a data processing module. The cost calculation module calculates a production cost, an unfulfilled demand cost, and a mask cost of a photolithography manufacturing process to produce a cost information. The capacity calculation module calculates a capacity of light sources, a capacity of shared equipments, and a capacity of specified equipments of the photolithography manufacturing process to produce a capacity information. The demand calculation module calculates a quantity of unfulfilled demand of the photolithography manufacturing process to produce an unfulfilled demand information according to the capacity information and a quantity of predicted demand provided by a user. The data processing module, connected to the cost calculation module, the capacity calculation module, and the demand calculation module, produces a planning result to the user according to the cost information, the capacity information, the unfulfilled demand information, and the user's planning targets.

Preferably, the capacity calculation module calculates the capacity information based on a number of light sources, a number of shared equipments, and a number of masks.

Preferably, the data processing module combines a plurality of information sets formed of the cost information, the capacity information, and the unfulfilled demand information in different production periods with the planning targets to produce the planning result to the user.

Preferably, the data processing module is equipped with a linear programming software to calculate and to produce the planning result.

Preferably, the data processing module is equipped with a document processing software for the user to manage documents.

According to another aspect of the present invention, providing a non-transitory computer readable media executing a photolithography capacity planning process, the process includes: Calculating a production cost, an unfulfilled demand cost, and a mask cost of a photolithography manufacturing process, and producing a cost information by a cost calculation module. Calculating a capacity of light sources, a capacity of shared equipments, and a capacity of specified equipments of the photolithography manufacturing process, and producing a capacity information by a capacity calculation module. Calculating a quantity of unfulfilled demand of the photolithography manufacturing process, and producing an unfulfilled demand information according to the capacity information and a quantity of predicted demand provided by a user by a demand calculation module. Producing a planning result to the user according to the cost information, the capacity information, the unfulfilled demand information, and the user's planning targets by a data processing module.

Preferably, the capacity calculation module calculates the capacity information based on a number of light sources, a number of shared equipments, and a number of masks.

Preferably, the data processing module combines a plurality of information sets formed of the cost information, the capacity information, and the unfulfilled demand information in different production periods with the planning targets to produce the planning result to the user.

Preferably, the data processing module is equipped with a linear programming software to calculate and to produce the planning result.

Preferably, the data processing module is equipped with a document processing software for the user to manage documents.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

The technical characteristics, contents, advantages and effects of the present invention will become apparent with the detailed description of the following embodiments and the illustration of related drawings as follows. All figures are drawn for ease of explanation of the basic teachings of the present invention only. The disclosed embodiments may be modified in various ways. The present invention is not limited to the disclosed embodiments. Rather, it covers all modifications, equivalents and substitutes to the disclosed embodiments. It is noteworthy that same numerals are used to represent respective same elements in the following preferred embodiments.

In accordance with the embodiment(s) of the present invention, the components, process steps, and/or data structures described herein may be implemented using various types of operating systems, computing platforms, computer programs, and/or, general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Figure 1:
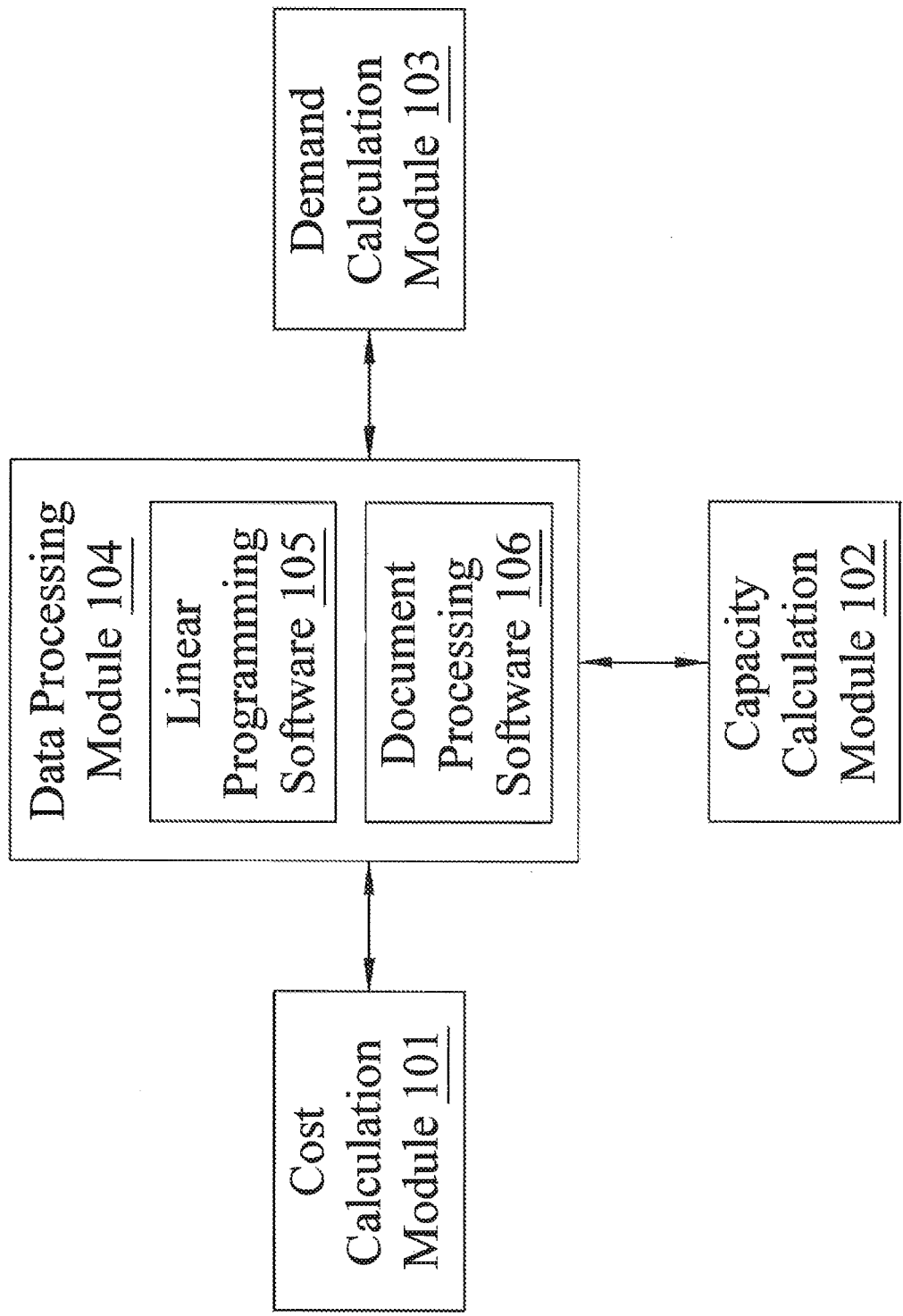
FIG. 1 is a block diagram of a photolithography capacity planning system of the present invention.

With reference to FIG. 1 for a block diagram of a photolithography capacity planning system of the present invention, a cost calculation module 101 calculates a production cost, an unfulfilled demand cost, and a mask cost of a photolithography manufacturing process to produce a cost information.

A capacity calculation module 102 calculates a capacity of light sources, a capacity of shared equipments, and a capacity of specified equipments of the photolithography manufacturing process to produce a capacity information.

A demand calculation module 103 calculates a quantity of unfulfilled demand of the photolithography manufacturing process to produce an unfulfilled demand information according to the capacity information and a quantity of predicted demand provided by a user.

A data processing module 104, connected to the cost calculation module 101, the capacity calculation module 102, and the demand calculation module 103, produces a planning result to the user according to the cost information, the capacity information, the unfulfilled demand information, and the user's planning targets.

Furthermore, the data processing module 104 is equipped with a linear programming software 105 to calculate and to produce the planning result.

Furthermore, the data processing module 104 is equipped with a document processing software 106 for the user to manage documents.

Figure 2:
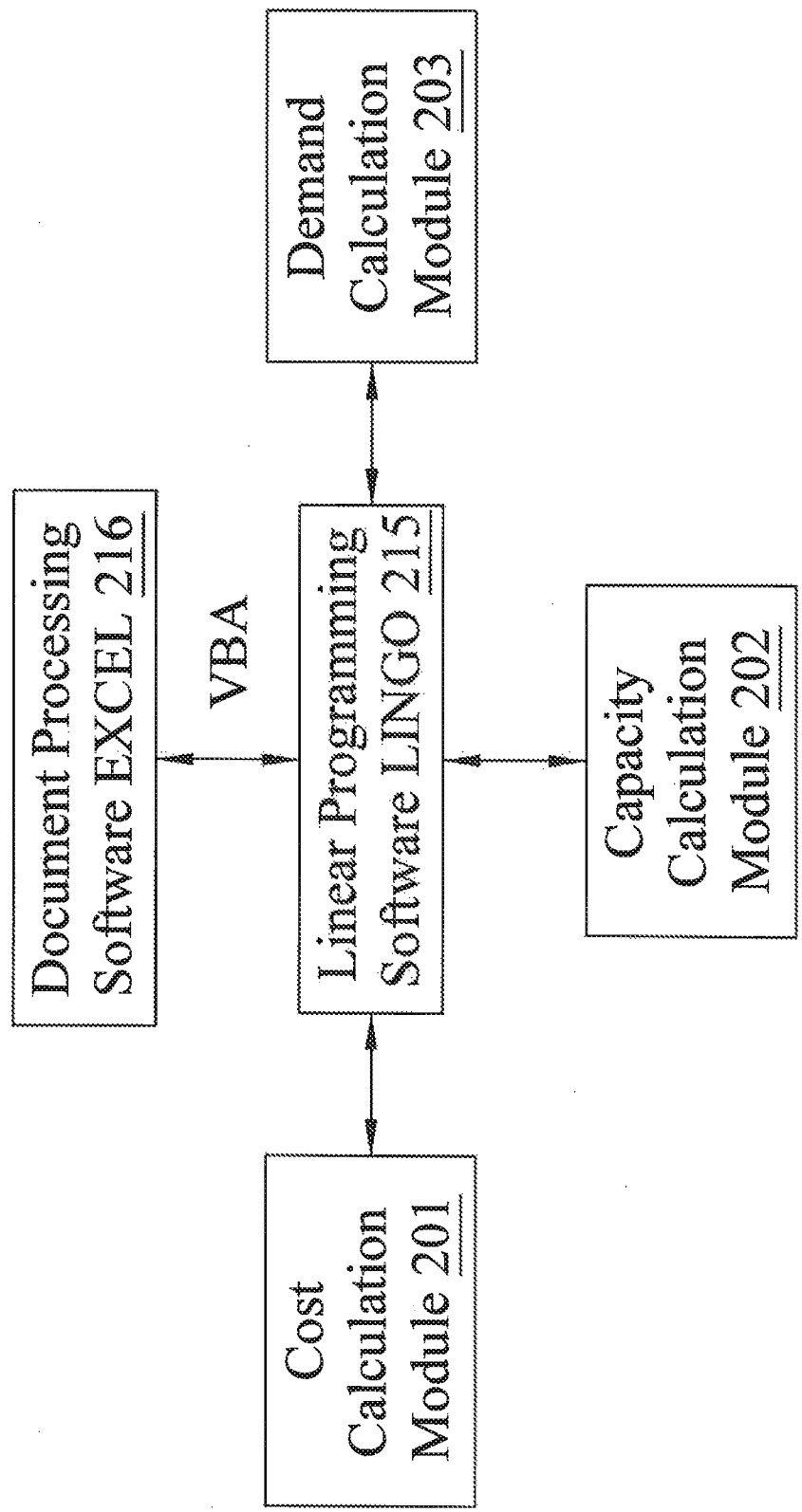
FIG. 2 is a block diagram of a photolithography capacity planning system according to an embodiment of the present invention.

With reference to FIG. 2 for a block diagram of a photolithography capacity planning system according to an embodiment of the present invention, a cost calculation module 201 calculates a production cost, an unfulfilled demand cost, and a mask cost of a photolithography manufacturing process to produce a cost information.

A capacity calculation module 202 calculates a capacity of light sources, a capacity of shared equipments, and a capacity of specified equipments of the photolithography manufacturing process to produce a capacity information.

A demand calculation module 203 calculates a quantity of unfulfilled demand of the photolithography manufacturing process to produce an unfulfilled demand information according to the capacity information and a quantity of predicted demand provided by a user.

A linear programming software LINGO 215 conducts a linear programming optimization based on the cost information, the capacity information, and the unfulfilled demand information provided by the cost calculation module 201, the capacity calculation module 202, and the demand calculation module 203, and based on the user's planning targets.

The linear programming software LINGO 215 is connected with the document processing software EXCEL 216 through VBA (Visual Basic for Application) macro language to provide a planning result to the user.

With the document processing software EXCEL 216, the user can manage documents conveniently.

Figure 3A:
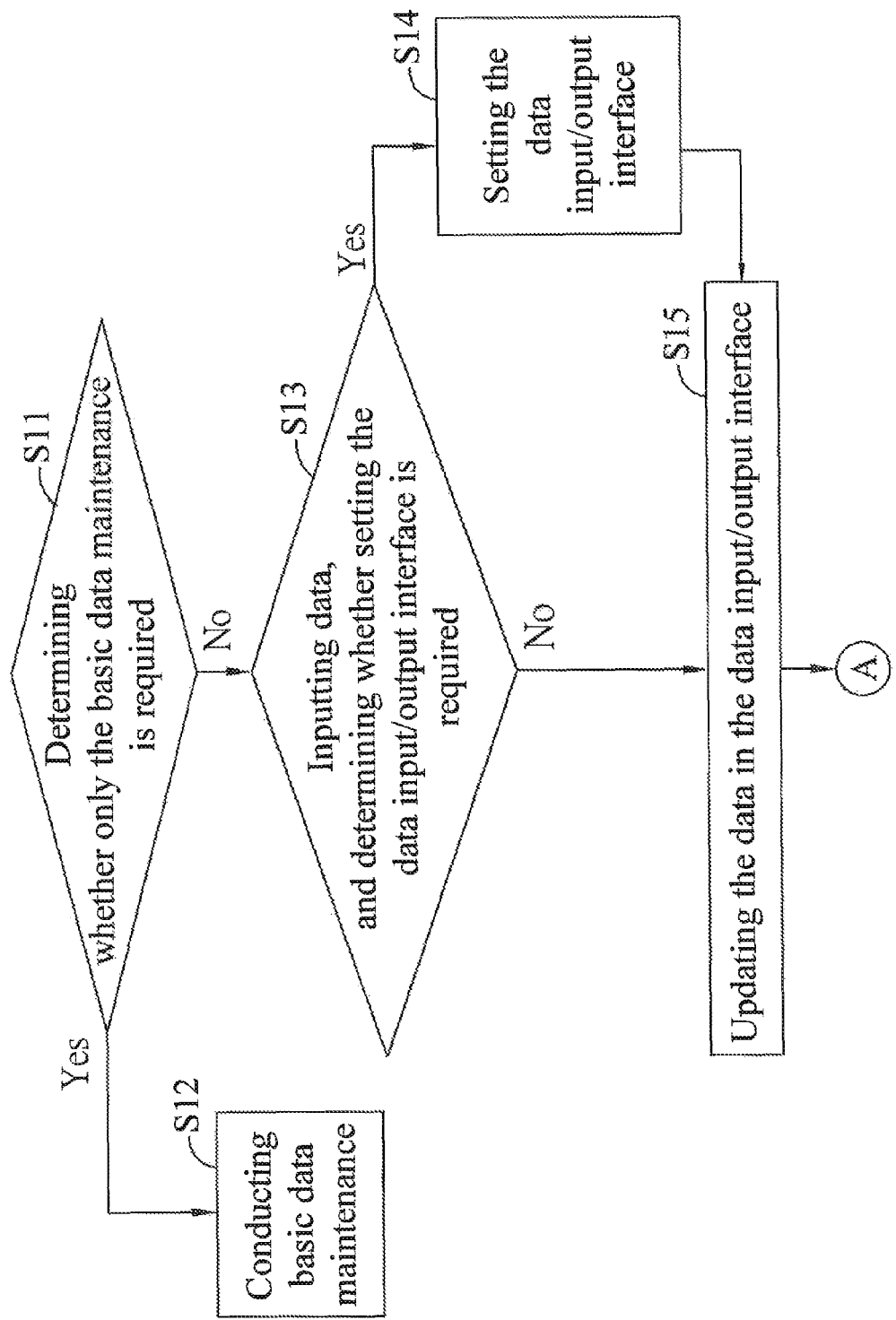
FIG. 3a-3b is a flowchart of a photolithography capacity planning process according to an embodiment of the present invention.
Figure 3B:
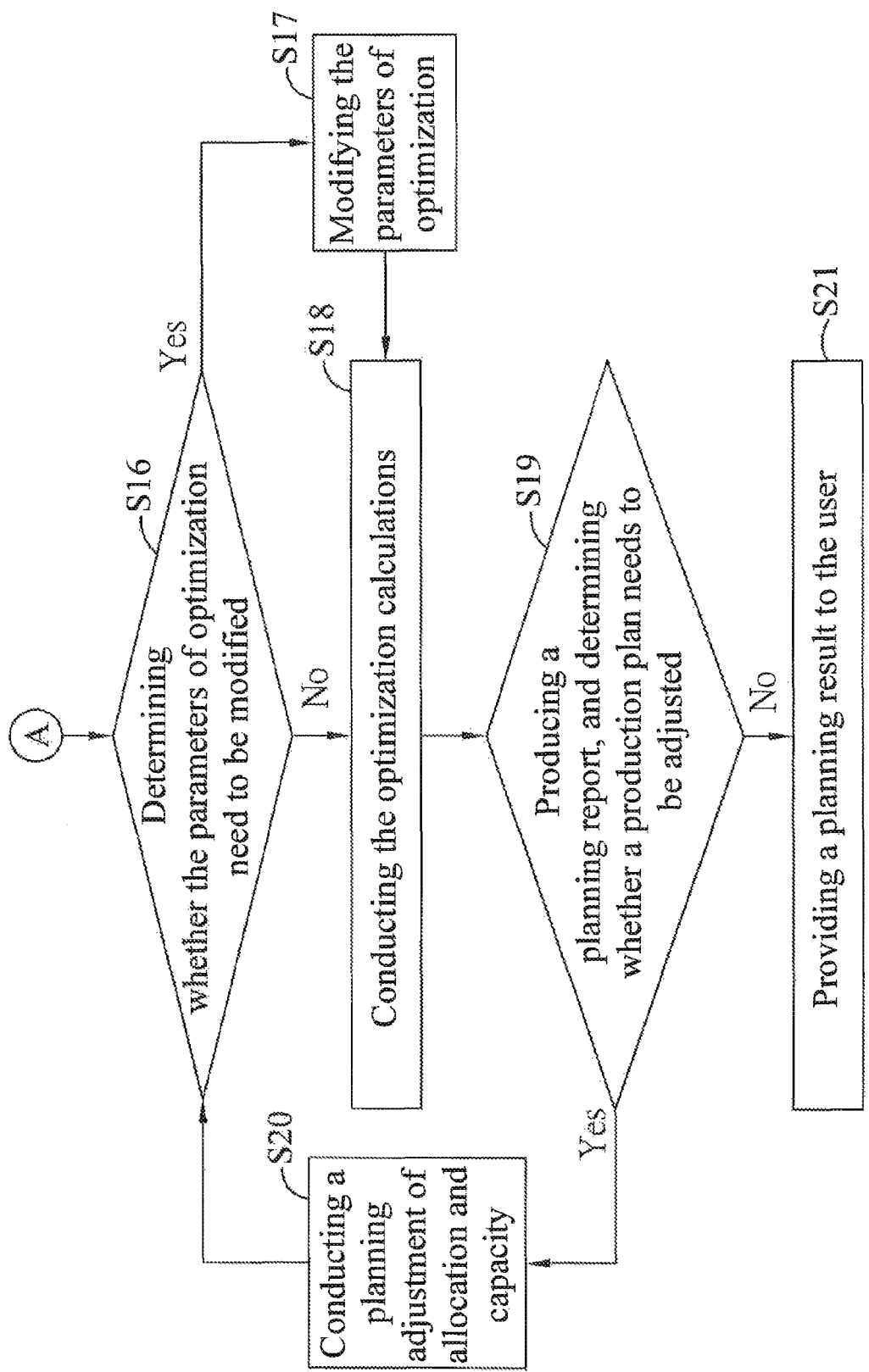

Referring to FIG. 3a-3b for a flowchart of a photolithography capacity planning process according to an embodiment of the present invention. In step S11, determining whether only the basic data maintenance is required. If the result is yes, move on to step S12. If the result is no, move on to step S13.

In step S12, conducting basic data maintenance.

In step S13, inputting data, and determining whether setting the data input/output interface is required. If the result is yes, move on to step S14. If the result is no, move on to step S15.

In step S14, setting the data input/output interface, move on to step S15.

In step S15, updating the data in the data input/output interface, move on to step S16.

In step S16, determining whether the parameters of optimization need to be modified. If the result is yes, move on to step S17. If the result is no, move on to step S18.

In step S17, modifying the parameters of optimization, move on to step S18.

In step S18, conducting the optimization calculations, move on to step S19.

In step S19, producing a planning report, and determining whether a production plan needs to be adjusted. If the result is yes, move on to step S20. If the result is no, move on to step S21.

In step S20, conducting a planning adjustment of allocation and capacity, move back to step S16.

In step S21, providing a planning result to the user.

For example, when using the photolithography capacity planning system, the user conducts basic data maintenance or data updating by the document processing software EXCEL, which is connected with linear programming software LINGO through VBA (Visual Basic for Application) macro language.

Linear programming software LINGO conducts a linear programming optimization based on the cost information, the capacity information, and the unfulfilled demand information provided by the cost calculation module, the capacity calculation module, and the demand calculation module, and based on the user's planning targets.

The production cost, mask cost, and unfulfilled demand cost can be expressed in the equation below. The goal is to calculate its minimum:

$$\text{Min}(CO + \rho) = \sum_{i \in E} \sum_{p \in P} \sum_{j \in F_i} \sum_{k \in K} \sum_{n \in Q} \sum_{m \in Q} CM_i y_{ipkbjnm} +$$

$$\sum_{i \in E} \sum_{p \in P} \sum_{j \in F_i} \sum_{k \in K} \sum_{n \in Q} \sum_{m \in Q} CM_i x_{ipkbjnm} +$$

$$\sum_{i \in E \cup N} \sum_{j \in F_i} \sum_{m \in Q} \sum_{k \in K} \sum_{p \in P} \sum_{t} CP_{ijm} q_{ijmkbpt} + \sum_{i \in E \cup N} \sum_{t} CU_i u_{it}$$

CO is the production cost and the mask cost, and $\rho$ is the unfulfilled demand cost. $CM_i$ is the mask cost of producing product i. $x_{ipkbjnm}$ is binary variables representing whether or not a product i in product group p using manufacturing process k and back-end manufacturing process b is produced in wafer plant j using equipment with m magnification ratio and mask with n magnification ratio. $y_{ipkbjnm}$ is binary variables representing whether or not an existing demanded product i in product group p using manufacturing process k and back-end manufacturing process b is produced in wafer plant j using equipment with m magnification ratio and mask with n magnification ratio. $CP_{ijm}$ is the production cost of wafer plant j producing product i using mask with m magnification ratio. $CU_i$ is an unit cost of unfulfilled demanded product i. $q_{ijmkbpt}$ is product i in product group p using manufacturing process k and back-end manufacturing process b produced in wafer plant j using equipment with m magnification ratio and mask with n magnification ratio in period t. $u_{it}$ is unfulfilled demanded product i in period t. Labels in upper case represent the whole set of corresponded labels in lower case.

The light source capacity constraints, the capacity constraints of specified equipments, and the capacity constraints of shared equipments of the capacity calculation module can be expressed in the equations below, respectively.

$$\sum_{i \in E \cup N} \sum_{j \in F_i} \sum_{m \in Q} \sum_{k \in K} \sum_{p \in P} \sum_{t} \frac{LR_{jmnrkbp} q_{ipkbjnmt}}{DR_{jmnrkbp}} \leq$$

$$caa_{jrt} + \sum_{j_1 \in F} \sum_{r_1 \in R} sca_{j_1 r_1 rt}, \forall j \in F, \forall t \in T, \forall r \in R_k$$

$$caa_{jrt} + \sum_{j_1 \in F} \sum_{r_1 \in R} sca_{j_1 r_1 rt} \leq CA_{jrt}, \forall j \in F, \forall t \in T, \forall r \in R_k$$

$$\sum_{i \in E \cup N} \sum_{n \in Q} \sum_{m \in Q} q_{ipkbjnmt} \leq CEL_{jkpgt}, \forall j \in F,$$

$$\forall k \in K, \forall p \in P, \forall g \in G, \forall t \in T$$

$LR_{jmnrkbp}$ is the number of photolithography manufacturing process required for product group p using manufacturing process k. and back-end manufacturing process b with specified equipment light source r and produced in wafer plant j. $q_{ijmkbpt}$ is product i in product group p using manufacturing process k and backend manufacturing process b produced in wafer plant j using equipment with m magnification ratio and mask with n magnification ratio in period t. $caa_{jrt}$ is the available specified equipment light source r in wafer plant j in period t. $sca_{jj_1 r_1 rt}$ is the specified equipment light source r1 in wafer plant j capable of supporting the specified equipment r in wafer plant j1 in period t. $CA_{jrt}$ is the available capacity of specified equipment light source r in wafer plant j in period t. $CEL_{jkbgt}$ is the capacity of shared equipments for product group g using manufacturing process k and backend manufacturing process b produced in wafer plant j. Labels in upper case represent the whole set of corresponded labels in lower case.

Furthermore, the capacity calculation module also includes the constraints of allocation, the constraints of verification time of manufacturing process of wafer plant, and the constraints of mask production time, which can be expressed in the equations below, respectively.

$$\sum_{p \in P} \sum_{k \in K} \sum_{j \in F_i} \sum_{n \in Q} \sum_{m \in Q} x_{ipkbjnm} \geq 1, \forall i \in N$$

$$pf_{ipkbjmn,t-1} + y_{ipkbjnm} = pf_{ipkbjmnt}, \forall t \in T, \forall i \in N,$$

$$\forall j \in F, \forall m \in Q, \forall k \in K, \forall p \in P, \forall b \in B$$

$$q_{ipkbjnmt} \leq pf_{ipkbjmnt} D_{it}, \forall t \in T, \forall i \in E \cup N,$$

$$\forall j \in F, \forall m \in Q, \forall k \in K, \forall p \in P$$

$$PFA_{ipkbjnm} + y_{ipkbjnm} \leq 1, \forall i \in N, \forall j \in F, \forall m \in Q, \forall k \in K, \forall p \in P$$

$pf_{ipkbjmnt}$ is product i in product group p using manufacturing process k and back-end manufacturing process b produced in wafer plant j using equipment with m magnification ratio and mask with n magnification ratio in period t. $y_{ipkbjnm}$ is binary variables representing whether or not an existing demanded product i in product group p using manufacturing process k and back-end manufacturing process b is produced in wafer plant j using equipment with m magnification ratio and mask with n magnification ratio. $q_{ijmkbpt}$ is product i in product group p using manufacturing process k and back-end manufacturing process b produced in wafer plant j using equipment with m magnification ratio and mask with n magnification ratio in period t. $D_{it}$ is the predicted demand of product i in period t. $PFA_{ipkbjnm}$ is the original allocation of product i in product group p using manufacturing process k and back-end manufacturing process b produced in wafer plant j using equipment with m magnification ratio and mask with n magnification ratio. Labels in upper case represent the whole set of corresponded labels in lower case.

The equality of demand information in the demand calculation module can be expressed in the equation below:

$$\sum_{p \in P} \sum_{k \in K} \sum_{j \in F_i} \sum_{n \in Q} \sum_{m \in Q} q_{ijmkpt} + u_{it} = D_{it}, \forall i \in E \cup N, t \in T$$

$q_{ijmkbpt}$ is product i in product group p using manufacturing process k and back-end manufacturing process b produced in wafer plant j using equipment with m magnification ratio and mask with n magnification ratio in period t. $u_{it}$ unfulfilled demanded product i in period t. $D_{it}$ is the predicted demand of product i in period t. Labels in upper case represent the whole set of corresponded labels in lower case.

It is worth noting that the constraint of verification time involves different production periods on the timeline. In other words, a plurality of information sets formed of the cost information, the capacity information, and the unfulfilled demand information in different production periods are considered when conducting the linear programming optimization.

When the demand for a certain product line increases and the wafer plant is not able to meet the increased demand, the linear programming software LINGO provides the unfulfilled demand information to the user through the document processing software EXCEL. The user decides how to meet the increased demand based on the planning report from the optimization of linear programming software LINGO. If the increased demand is for low end product line and that high end product line has surplus capacity to make equipment adjustment to support low end product line, the user can determine whether or not to make equipment adjustment for high end product line to carry out capacity allocation based on the planning report from the optimization of the linear programming software LINGO.

Furthermore, if the increased demand is for high end product line, or the increased demand is for low end product line while high end product line does not have surplus capacity to make equipment adjustment to meet the increased demand, the user can determine whether or not to produce more masks or increase equipments to carry out demand allocation based on the planning report from the optimization of the linear programming software LINGO.

Furthermore, if the user decides that the planning report from the optimization of the linear programming software LINGO is not suitable for the planning result, the user can make planning adjustment and modify relevant parameters in the optimization to obtain a new planning report.

The above drawings and detailed description of the present invention are provided as examples of the present invention, not for limiting purposes. Various changes in form and details may be made therein without departing from the spirit and scope of the present invention as defined by the following claims.

What is claimed is:

1. A photolithography capacity planning system, comprising:
    a cost calculation module, calculating a production cost, an unfulfilled demand cost, and a mask cost of a photolithography manufacturing process to produce a cost information;
    a capacity calculation module, calculating a capacity of light sources, a capacity of shared equipments, and a capacity of specified equipments of the photolithography manufacturing process to produce a capacity information;
    a demand calculation module, calculating a quantity of unfulfilled demand of the photolithography manufacturing process to produce an unfulfilled demand information according to the capacity information and a quantity of predicted demand provided by a user;
    a data processing module, connected to the cost calculation module, the capacity calculation module, and the demand calculation module, producing a planning result to the user according to the cost information, the capacity information, the unfulfilled demand information, and the user's planning targets to enable the user to determine whether or not to produce more masks or increase equipments,
    wherein a minimum of the production cost, the mask cost, and the unfulfilled demand cost is calculated and expressed in the equation below:

$$Min(CO+\rho) = \sum_{i \in E} \sum_{p \in P} \sum_{j \in F_i} \sum_{k \in K} \sum_{n \in Q} \sum_{m \in Q} CM_i y_{ipkbjnm} +$$
$$\sum_{i \in E} \sum_{p \in P} \sum_{j \in F_i} \sum_{k \in K} \sum_{n \in Q} \sum_{m \in Q} CM_i x_{ipkbjnm} +$$

-continued
$$\sum_{i \in E \cup N} \sum_{j \in F_i} \sum_{m \in Q} \sum_{k \in K} \sum_{p \in P} \sum_{t} CP_{ijm} q_{ijmkbpt} + \sum_{i \in E \cup N} \sum_{t} CU_i u_{it}$$

wherein CO is the production cost and the mask cost,
ρ is the unfulfilled demand cost,
$CM_i$ is the mask cost of producing product i,
$x_{ipkbjnm}$ is binary variables representing whether or not a product i in product group p using manufacturing process k and back-end manufacturing process b is produced in wafer plant j using equipment with m magnification ratio and mask with n magnification ratio,
$y_{ipkbjnm}$ is binary variables representing whether or not an existing demanded product i in product group p using manufacturing process k and back-end manufacturing process b is produced in wafer plant j using equipment with m magnification ratio and mask with n magnification ratio,
$CP_{ijm}$ is the production cost of wafer plant j producing product i using mask with m magnification ratio,
$CU_i$ is an unit cost of unfulfilled demanded product i,
$q_{ijmkbpt}$ is product i in product group p using manufacturing process k and back-end manufacturing process b produced in wafer plant j using equipment with m magnification ratio and mask with n magnification ratio in period t,
$u_{it}$ is unfulfilled demanded product i in period t, and labels in upper case represent the whole set of corresponded labels in lower case.

2. The photolithography capacity planning system of claim 1, wherein the capacity calculation module calculates the capacity information based on a number of light sources, a number of shared equipments, and a number of masks.

3. The photolithography capacity planning system of claim 1, wherein the data processing module combines a plurality of information sets formed of the cost information, the capacity information, and the unfulfilled demand information in different production periods with the planning targets to produce the planning result to the user.

4. The photolithography capacity planning system of claim 1, wherein the data processing module is equipped with a linear programming software to calculate and to produce the planning result.

5. The photolithography capacity planning system of claim 1, wherein the data processing module is equipped with a document processing software for the user to manage documents.

6. A non-transitory computer readable media executing a photolithography capacity planning process, the process comprising:
    calculating a production cost, an unfulfilled demand cost, and a mask cost of a photolithography manufacturing process, and producing a cost information by a cost calculation module;
    calculating a capacity of light sources, a capacity of shared equipments, and a capacity of specified equipments of the photolithography manufacturing process, and producing a capacity information by a capacity calculation module;
    calculating a quantity of unfulfilled demand of the photolithography manufacturing process, and producing an unfulfilled demand information according to the capacity information and a quantity of predicted demand provided by a user by a demand calculation module; and
    producing a planning result to the user according to the cost information, the capacity information, the unfulfilled demand information, and the user's planning targets by a data processing module to enable the user to determine whether or not to produce more masks or increase equipments, wherein a minimum of the production cost, the mask cost, and the unfulfilled demand cost is calculated and expressed in the equation below:

$$\text{Min}(CO+\rho) = \sum_{i\in E}\sum_{p\in P}\sum_{j\in F_i}\sum_{k\in K}\sum_{n\in Q}\sum_{m\in Q} CM_i y_{ipkbjnm} +$$

$$\sum_{i\in E}\sum_{p\in P}\sum_{j\in F_i}\sum_{k\in K}\sum_{n\in Q}\sum_{m\in Q} CM_i x_{ipkbjnm} +$$

$$\sum_{i\in E\cup N}\sum_{j\in F_i}\sum_{m\in Q}\sum_{k\in K}\sum_{p\in P}\sum_{t} CP_{ijm} q_{ijmkbpt} + \sum_{i\in E\cup N}\sum_{t} CU_i u_{it}$$

wherein CO is the production cost and the mask cost,

ρ is the unfulfilled demand cost, $CM_i$ is the mask cost of producing product i, $x_{ipkbjnm}$ is binary variables representing whether or not a product i in product group p using manufacturing process k and back-end manufacturing process b is produced in wafer plant j using equipment with m magnification ratio and mask with n magnification ratio, $y_{ipkbjnm}$ is binary variables representing whether or not an existing demanded product i in product group p using manufacturing process k and back-end manufacturing process b is produced in wafer plant j using equipment with m magnification ratio and mask with n magnification ratio, $CP_{ijm}$ is the production cost of wafer plant i producing product i using mask with m magnification ratio, $CU_i$ is an unit cost of unfulfilled demanded product i, $q_{ijmkbpt}$ is product i in product group p using manufacturing process k and back-end manufacturing process b produced in wafer plant j using equipment with m magnification ratio and mask with n magnification ratio in period t, $u_{it}$ is unfulfilled demanded product i in period t, and labels in upper case represent the whole set of corresponded labels in lower case.

7. The non-transitory computer readable media of claim 6, wherein the capacity calculation module calculates the capacity information based on a number of light sources, a number of shared equipments, and a number of masks.

8. The non-transitory computer readable media of claim 6, wherein the data processing module combines a plurality of information sets formed of the cost information, the capacity information, and the unfulfilled demand information in different production periods with the planning targets to produce the planning result to the user.

9. The non-transitory computer readable media of claim 6, wherein the data processing module is equipped with a linear programming software to calculate and to produce the planning result.

10. The non-transitory computer readable media of claim 6, wherein the data processing module is equipped with a document processing software for the user to manage documents.

11. The photolithography capacity planning system of claim 1, wherein a light source capacity constraints, a capacity constraints of specified equipments, and a capacity constraints of shared equipments of the capacity calculation module are expressed in the equations below, respectively:

$$\sum_{i\in E\cup N}\sum_{j\in F_i}\sum_{m\in Q}\sum_{k\in K}\sum_{p\in P} \frac{LR_{jmnrkbp} q_{ipkbjnmt}}{DR_{jmnrkbp}} \leq caa_{jrt} + \sum_{j_1\in F}\sum_{r_1\in R} sca_{j_1 r_1 rt},$$

$$\forall j \in F, \forall t \in T, \forall r \in R_k$$

$$caa_{jrt} + \sum_{j_1\in F}\sum_{r_1\in R} sca_{j_1 r_1 rt} \leq CA_{jrt}, \forall j \in F, \forall t \in T, \forall r \in R_k$$

$$\sum_{i\in E\cup N}\sum_{n\in Q}\sum_{m\in Q} q_{ipkbjnmt} \leq CEL_{jkpgt}, \forall j \in F,$$

$$\forall k \in K, \forall p \in P, \forall g \in G, \forall t \in T$$

wherein $LR_{jmnrkbp}$ is the number of photolithography manufacturing process required for product group p using manufacturing process k and back-end manufacturing process b with specified equipment light source r and produced in wafer plant j, $q_{ijmkbpt}$ is product i in product group p using manufacturing process k and back-end manufacturing process b produced in wafer plant j using equipment with m magnification ratio and mask with n magnification ratio in period t, $caa_{jrt}$ is the available specified equipment light source r in wafer plant j in period t, $sca_{j_1 r_1 rt}$ is the specified equipment light source r1 in wafer plant j capable of supporting the specified equipment r in wafer plant j1 in period t, $CA_{jrt}$ is the available capacity of specified equipment light source r in wafer plant j in period t, $CEL_{jkbgt}$ is the capacity of shared equipments for product group g using manufacturing process k and back-end manufacturing process b produced in wafer plant j, and labels in upper case represent the whole set of corresponded labels in lower case.

12. The photolithography capacity planning system of claim 11, wherein the capacity calculation module further comprises the constraints of allocation, the constraints of verification time of manufacturing process of wafer plant, and the constraints of mask production time, which are expressed in the equations below, respectively:

$$\sum_{p\in P}\sum_{k\in K}\sum_{j\in F_i}\sum_{n\in Q}\sum_{m\in Q} x_{ipkbjnm} \geq 1, \forall i \in N$$

$$pf_{ipkbjmn,t-1} + y_{ipkbjmn} = pf_{ipkbjmnt}, \forall t \in T, \forall i \in N,$$

$$\forall j \in F, \forall m \in Q, \forall k \in K, \forall p \in P, \forall b \in B$$

$$q_{ipkbjmnt} \leq pf_{ipkbjmnt} D_{it}, \forall t \in T, \forall i \in E \cup N,$$

$$\forall j \in F, \forall m \in Q, \forall k \in K, \forall p \in P$$

$$PFA_{ipkbjnm} + y_{ipkbjnm} \leq 1, \forall i \in N, \forall j \in F, \forall m \in Q, \forall k \in K, \forall p \in P$$

wherein $pf_{ipkbjmnt}$ is product i in product group p using manufacturing process k and back-end manufacturing process b produced in wafer plant j using equipment with m magnification ratio and mask with n magnification ratio in period t, $y_{ipkbjnm}$ is binary variables representing whether or not an existing demanded product i in product group p using manufacturing process k and back-end manufacturing process b is produced in wafer plant j using equipment with m magnification ratio and mask with n magnification ratio, $q_{ijmkbpt}$ is product i in product group p using manufacturing process k and back-end manufacturing process b produced in wafer plant j using equipment with m magnification ratio and mask with n magnification ratio in period t, $D_{it}$ is the predicted demand of product i in period t, $PFA_{ipkbjmn}$ is the original allocation of product i in product group p using manufacturing process k and back-end manufacturing process b produced in wafer plant j using equipment with m magnification ratio and mask with n magnification ratio, and labels in upper case represent the whole set of corresponded labels in lower case.

13. The photolithography capacity planning system of claim 12, wherein an equality of demand information in the demand calculation module is expressed in the equation below:

$$\sum_{p \in P} \sum_{k \in K} \sum_{j \in F_i} \sum_{n \in Q} \sum_{m \in Q} q_{ijmkpt} + u_{it} = D_{it}, \forall i \in E \cup N, t \in T$$

wherein $q_{ijmkbpt}$ is product i in product group p using manufacturing process k and back-end manufacturing process b produced in wafer plant j using equipment with m magnification ratio and mask with n magnification ratio in period t, $u_{it}$ is unfulfilled demanded product i in period t, $D_{it}$ is the predicted demand of product i in period t, and labels in upper case represent the whole set of corresponded labels in lower case.

14. The non-transitory computer readable media of claim 6, wherein a light source capacity constraints, a capacity constraints of specified equipments, and a capacity constraints of shared equipments of the capacity calculation module are expressed in the equations below, respectively:

$$\sum_{i \in E \cup N} \sum_{j \in F_i} \sum_{m \in Q} \sum_{k \in K} \sum_{p \in P} \frac{LR_{jmnrkbp} q_{ipkbjnmt}}{DR_{jmnrkbp}} \le caa_{jrt} + \sum_{j_1 \in F} \sum_{r_1 \in R} sca_{j_1 r_1 rt},$$

$$\forall j \in F, \forall t \in T, \forall r \in R_k$$

$$caa_{jrt} + \sum_{j_1 \in F} \sum_{r_1 \in R} sca_{j_1 r_1 rt} \le CA_{jrt}, \forall j \in F, \forall t \in T, \forall r \in R_k$$

$$\sum_{i \in E \cup N} \sum_{n \in Q} \sum_{m \in Q} q_{ipkbjnmt} \le CEL_{jkpgt}, \forall j \in F,$$

$$\forall k \in K, \forall p \in P, \forall g \in G, \forall t \in T$$

wherein $LR_{jmnrkbp}$ is the number of photolithography manufacturing process required for product group p using manufacturing process k and back-end manufacturing process b with specified equipment light source r and produced in wafer plant j, $q_{ijmkbpt}$ is product i in product group p using manufacturing process k and back-end manufacturing process b produced in wafer plant j using equipment with m magnification ratio and mask with n magnification ratio in period t, $caa_{jrt}$ is the available specified equipment light source r in wafer plant j in period t, $sca_{jj_1 r_1 rt}$ is the specified equipment light source r1 in wafer plant j capable of supporting the specified equipment r in wafer plant j1 in period t, $CA_{jrt}$ is the available capacity of specified equipment light source r in wafer plant j in period t, $CEL_{jkbgt}$ is the capacity of shared equipments for product group g using manufacturing process k and back-end manufacturing process b produced in wafer plant j, and labels in upper case represent the whole set of corresponded labels in lower case.

15. The non-transitory computer readable media of claim 14, wherein the capacity calculation module further comprises the constraints of allocation, the constraints of verification time of manufacturing process of wafer plant, and the constraints of mask production time, which are expressed in the equations below, respectively:

$$\sum_{p \in P} \sum_{k \in K} \sum_{j \in F_i} \sum_{n \in Q} \sum_{m \in Q} x_{ipkbjnm} \ge 1, \forall i \in N$$

$$pf_{ipkbjmn,t-1} + y_{ipkbjnm} = pf_{ipkbjmnt}, \forall t \in T, \forall i \in N,$$

$$\forall j \in F, \forall m \in Q, \forall k \in K, \forall p \in P, \forall b \in B$$

$$q_{ipkbjmnt} \le pf_{ipkbjmnt} D_{it}, \forall t \in T, \forall i \in E \cup N,$$

$$\forall j \in F, \forall m \in Q, \forall k \in K, \forall p \in P$$

$$PFA_{ipkbjnm} + y_{ipkbjnm} \le 1, \forall i \in N, \forall j \in F, \forall m \in Q, \forall k \in K, \forall p \in P$$

wherein $pf_{ipkbjmnt}$ is product i in product group p using manufacturing process k and back-end manufacturing process b produced in wafer plant j using equipment with m magnification ratio and mask with n magnification ratio in period t, $y_{ipkbjnm}$ is binary variables representing whether or not an existing demanded product i in product group p using manufacturing process k and back-end manufacturing process b is produced in wafer plant j using equipment with m magnification ratio and mask with n magnification ratio, $q_{ijmkbpt}$ is product i in product group p using manufacturing process k and back-end manufacturing process b produced in wafer plant j using equipment with m magnification ratio and mask with n magnification ratio in period t, $D_{it}$ is the predicted demand of product i in period t, $PFA_{ipkbjmn}$ is the original allocation of product i in product group p using manufacturing process k and back-end manufacturing process b produced in wafer plant j using equipment with m magnification ratio and mask with n magnification ratio, and labels in upper case represent the whole set of corresponded labels in lower case.

16. The non-transitory computer readable media of claim 15, wherein an equality of demand information in the demand calculation module is expressed in the equation below:

$$\sum_{p \in P} \sum_{k \in K} \sum_{j \in F_i} \sum_{n \in Q} \sum_{m \in Q} q_{ijmkpt} + u_{it} = D_{it}, \forall i \in E \cup N, t \in T$$

wherein $q_{ijmkbpt}$ is product i in product group p using manufacturing process k and back-end manufacturing process b produced in wafer plant j using equipment with m magnification ratio and mask with n magnification ratio in period t, $u_{it}$ is unfulfilled demanded product i in period t, $D_{it}$ is the predicted demand of product i in period t, and labels in upper case represent the whole set of corresponded labels in lower case.

* * * * *